US011935393B2

(12) United States Patent
Adkins, Jr. et al.

(10) Patent No.: US 11,935,393 B2
(45) Date of Patent: Mar. 19, 2024

(54) SMART WIRELESS COMMUNICATION DEVICE

(71) Applicant: Grace Technologies, Inc., Davenport, IA (US)

(72) Inventors: Charles Ronald Adkins, Jr., Newell, WV (US); Gang Chen, Newell, WV (US)

(73) Assignee: GRACE TECHNOLOGIES, INC., Davenport, IA (US)

( * ) Notice: Subject to any disclaimer, the term of this patent is extended or adjusted under 35 U.S.C. 154(b) by 92 days.

(21) Appl. No.: 17/523,262

(22) Filed: Nov. 10, 2021

(65) Prior Publication Data

US 2022/0148392 A1  May 12, 2022

Related U.S. Application Data

(60) Provisional application No. 63/198,745, filed on Nov. 10, 2020.

(51) Int. Cl.
*G08B 5/22* (2006.01)
*G01R 19/00* (2006.01)
*H04Q 9/00* (2006.01)
*H04W 4/80* (2018.01)
*H04W 84/18* (2009.01)

(52) U.S. Cl.
CPC ............ *G08B 5/22* (2013.01); *G01R 19/00* (2013.01); *H04Q 9/00* (2013.01); *H04Q 2209/40* (2013.01); *H04W 4/80* (2018.02); *H04W 84/18* (2013.01)

(58) Field of Classification Search
CPC .. H04Q 9/00; H04Q 2209/00; H04Q 2209/10; H04Q 2209/20; H04Q 2209/25; H04Q 2209/40; H04Q 2209/80; H04Q 2209/82; H04Q 2209/84; G01R 19/00; G08B 5/22; H04W 4/80; H04W 84/18
See application file for complete search history.

(56) References Cited

U.S. PATENT DOCUMENTS

| 5,963,650 | A  | * | 10/1999 | Simionescu | G06Q 50/06 340/870.11 |
| 6,703,938 | B1 | * | 3/2004 | Clarke | G01R 19/155 340/687 |
| 9,149,228 | B2 | * | 10/2015 | Kinast | A61B 5/6822 |
| 11,307,062 | B2 | * | 4/2022 | Zafar | H04Q 9/00 |
| 11,545,027 | B2 | * | 1/2023 | Subramaniam | G08C 17/02 |
| 2017/0272844 | A1 | * | 9/2017 | Bergqvist | F04D 15/0066 |
| 2019/0146015 | A1 | * | 5/2019 | Allen | G01R 19/2513 324/107 |
| 2020/0138288 | A1 | * | 5/2020 | Al-Ali | A61B 5/0024 |

* cited by examiner

*Primary Examiner* — Franklin D Balseca
(74) *Attorney, Agent, or Firm* — Goodhue, Coleman & Owens, P.C.

(57) ABSTRACT

According to various features described herein, a wireless connection device facilitates providing wireless transmission of detected voltages on monitored lines, and comprises: a communication connector via which the wireless communication device receives detected voltage information for one or more monitored lines; and one or more printed circuit boards (PCB)s comprising circuitry for processing the received detected voltage information; and a wireless transceiver that transmits the processed voltage information wirelessly for presentation and storage on a remote device.

20 Claims, 14 Drawing Sheets

T2-T1: 71.4 ms 30V 3Phase input L1

T2-T1 1.453 ms 30V 3 Phase L1 Pulse Width

T2 - T1  31.596 ms
120V 3 Phase L1 Outputs

T2-T1  2.243ms
120V 3Phase Pulse Width

T2-T1 23.381ms
240V 3P L1 Outputs

T2-T1 4.107ms
240V 3P L1 Pulse width

T2-T1 16.746ms
480V 3P L1 outputs

T2-T1 3.160ms
480V 3P L1 Pulse Width

T2-T1 26.856ms
120VDC L1 output

T2-T1 1.738ms
120V DC L1 Pulse width

SMART WIRELESS COMMUNICATION DEVICE

CROSS-REFERENCE TO RELATED APPLICATIONS

The present application claims priority to U.S. Provisional patent application Ser. No. 63/198,745, filed on 10 Nov. 2020, the entirety of which is incorporated herein by reference.

BACKGROUND

The following relates to the electrical power arts. It particularly relates to monitoring a safe electrical disconnection of a high voltage circuit for servicing, and will be described with particular reference thereto. However, the following will also find application in routine monitoring of electrical line voltages and in other aspects of electrical safety.

To verify electrical isolation, electrical safety monitors which monitor electrical energy potentials of monitored electrical lines of an electrical panel are utilized. The electrical safety monitors provide a warning with light emitting diode ("LED") indicators in response to an electrical potential being present on the monitored lines. During servicing, electricians verify normal operation of the indicators while the panel is powered and then verify all of the indicators are extinguished while the panel is powered down before opening the panel. Although electrical safety monitors have proven to be reliable, final verification by lack of illumination provides less assurance than desired due to the possibility of circuit failure or malfunction which could likewise be the culprit for extinguished indicators and not just the absence of voltage on the monitored lines.

Additionally, although the operating current required for indication is extremely low, typically less than 1 milliampere at 750 VAC 3-phase, the electrical safety monitors are often rated for 750 VAC continuous operation or more, and the monitored line voltages entering the monitor are at full 3-phase line voltage potentials. To further electrically isolate the electrical safety monitors due to the high energy potential during operation, the housing of these monitors are typically non-conductive and the electronics are fully encapsulated in a high quality thermoset potting compound. It is desired to have the electrical safety monitor include a separate internally mounted electrical package and display adaptor mounted in the panel to provide an indication when an electrical potential is present on the monitored lines.

The following description contemplates an improved approach that overcomes the aforementioned limitations and others.

SUMMARY

The subject innovation relates to a Smart voltage detection device that incorporates the detection circuitry of a permanently mounted voltage detection device while adding detection that can be then transferred to a secondary wireless device 40 that can in turn transmit the detected voltage to third monitoring and/or recording device. By keeping the main indication on the permanently mounted voltage detection device, the voltage present on monitored lines can be visually and remotely verified at a connected location and can communicate with or without the secondary wireless transmission device. This embodiment the wireless device, while connected to the permanently mounted voltage detection device, can transmit voltage status and actionable status information with the capability of logging the recorded voltage with the time stamp of last status. In another embodiment the wireless connection device is fully integrated into the permanently mounted voltage detection device.

According to one aspect, a wireless connection device that facilitates providing wireless transmission of detected voltages on monitored lines comprises a communication connector via which the wireless communication device receives detected voltage information for one or more monitored lines, one or more printed circuit boards (PCB)s comprising circuitry for processing the received detected voltage information, and a wireless transceiver that transmits the processed voltage, data and actionable information wirelessly for presentation and storage on a remote device.

According to another aspect, a wireless connection device that facilitates providing wireless transmission of detected voltages on monitored lines, comprising: a single housed device comprising: a wireless communication module that receives detected voltage information for one or more monitored lines; one or more printed circuit boards (PCBs) comprising circuitry for processing the received detected voltage information; and a wireless transceiver that transmits the processed voltage information and actionable status information wirelessly for presentation and storage on a remote device.

DETAILED DESCRIPTION

The problem to be solved relates to how to monitor and track the status of the voltage from electrical enclosures while maintaining a direct voltage indication (e.g., via LEDs or the like) on the connected voltage detection device 10 and also providing wireless transmission of the information to a secondary device to be monitored and recorded without losing the indication on the permanently mounted voltage detection device 10. The devices that are available today have no way to transmit the data out to a secondary system or they have no indication on the connected device and relay solely on the wireless transmission for the indication with no way of determining whether there is power present on the connected device. Conventional attempts to employ a remote device to monitor the line run on a secondary power source and when power is depleted the indication is lost.

To solve these problems, the Smart set of devices incorporates the detection circuitry of a permanently mounted voltage detection devices while adding detection that can be then transferred to a secondary wireless device 40 that can transmit the detected voltage to third monitoring and/or recording device. By keeping the main indication of the voltage detection with the permanently mounted device, the voltage present can be visually and remotely verified at a connected location and can communicate with or without the secondary wireless transmission device. In this embodiment the wireless device 40, while connected, can transmit voltage status and actionable status information with the capability of logging the record voltage with the time stamp of the last status. In another embodiment the wireless device 40, is fully integrated into the permanently mounted voltage detection device that transmits the voltage status and actionable status information with the capability of logging recorded voltage and actionable status with the time stamp.

Figure 1:
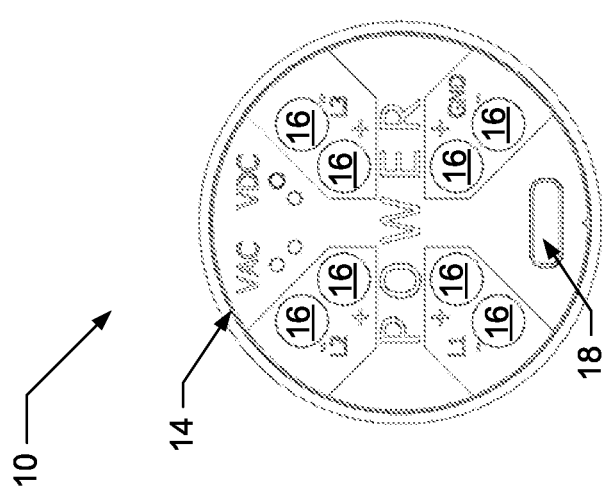
FIG. 1 illustrates a system that facilitates providing a wireless voltage testing interface, in accordance with one or more aspects described herein.

FIG. 1 illustrates a system 10 that facilitates providing a wireless voltage testing interface, in accordance with one or more aspects described herein. The system comprises a front plate or panel (not shown in FIG. 1; See FIGS. 2 and 3) of an electrical enclosure box into which is mounted a voltage indicator 14 (e.g., such as a voltage detector indicator such as may be similar to those described in U.S. Pat. Nos. 6,703,938 and 9,013,296, which are hereby incorporated by reference in their entireties herein) comprising a plurality of LED indicators 16 (shown as circles on the voltage indicator 14) that indicate a status of one or more circuits coupled thereto and monitored thereby. The voltage indicator 14 also comprises a USB port 18. Although depicted as a USB-C type port in the example of FIG. 1, it will be understood that any suitable USB port (e.g., min USB, micro USB, etc.) may be employed in accordance with various embodiments.

Figure 2:
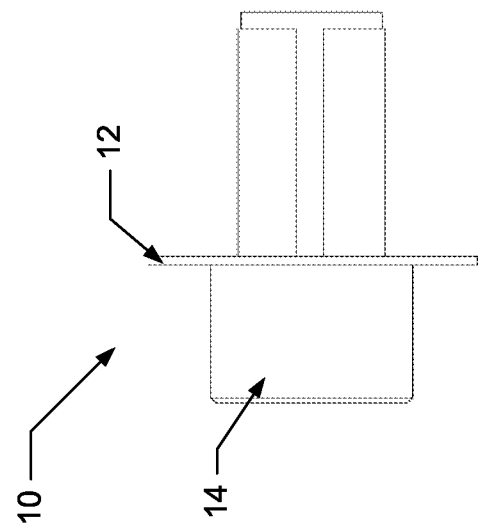
FIG. 2 illustrates a side view of the system showing the voltage indicator, in accordance with one or more features described herein.

FIG. 2 illustrates a side view of the system 10 showing the voltage indicator 14, in accordance with one or more features described herein. The illustration shows a front plate or panel 12 through which the voltage indicator 14 is mounted.

Figure 3:
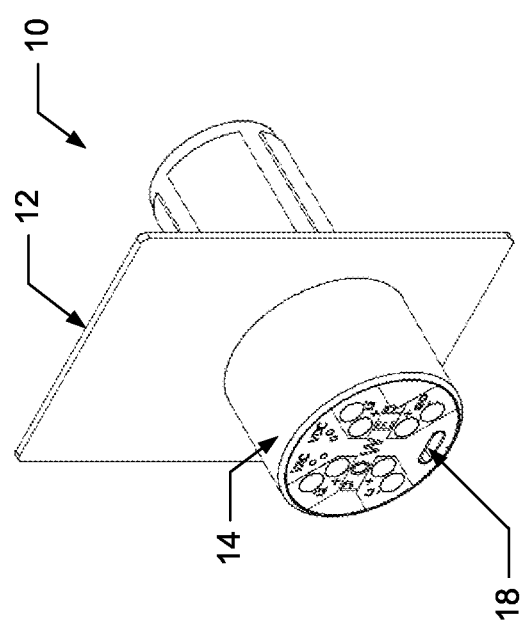
FIG. 3 illustrates a perspective view of the system, wherein the voltage indicator is mounted through a surface of an electrical enclosure or the like, in accordance with one or more features described herein.

FIG. 3 illustrates a perspective view of the system 10, wherein the voltage indicator 14 is mounted through the front panel 12 of an electrical enclosure box or the like, in accordance with one or more features described herein. Also shown on the voltage indicator face is the USB port 18.

Figure 4:
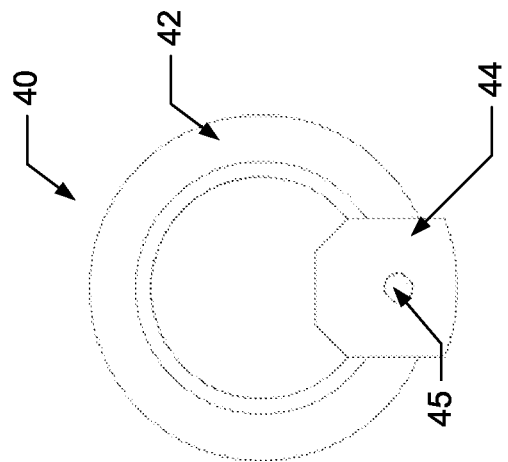
FIG. 4 illustrates a front view of a wireless connection device, in accordance with various features described herein.

FIG. 4 illustrates a front view of a wireless connection device 40, in accordance with various features described herein. The wireless connection device 40 comprises a ring portion 42 that slides over an outward facing portion of the voltage detector 14, wherein the ring portion mates flush against the front plate 12 (FIG. 3) when installed. The device 40 also comprises a body portion 44 that comprises electronic circuitry for voltage data storage and transmission, as well as a wireless communication device (e.g., transceiver, circuitry, etc.). The device 40 also comprises a communication status indicator 45.

Figure 5:
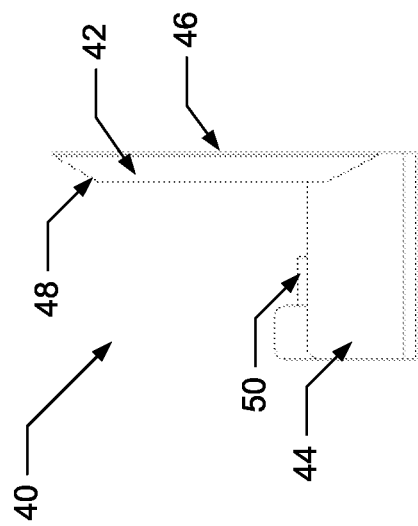
FIG. 5 illustrates a side view of the wireless connection device, in accordance with various features described herein.

FIG. 5 illustrates a side view of the wireless connection device 40, in accordance with various features described herein. The wireless connection device 40 comprises a ring portion 42 that slides over an outward facing portion of the voltage detector 14, wherein the ring portion has a flat rear surface 46 that mates flush against the front plate 12 (FIG. 3) when installed. The ring portion also has a beveled front surface 48. The device 40 also comprises a body portion 44 that comprises electronic circuitry for voltage data storage and transmission. A USB connector 50 (e.g., C-type or other suitable USB connector) is also provided, which is received by the USB port (See FIGS. 1 and 3) on the voltage detector for data communication.

Figure 6:
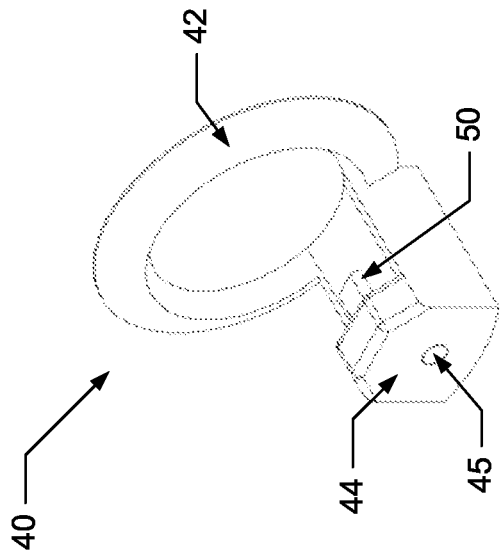
FIG. 6 illustrates a perspective view of the wireless connection device, in accordance with various features described herein.

FIG. 6 illustrates a perspective view of the wireless connection device 40, in accordance with various features described herein. The wireless connection device 40 comprises a ring portion 42 that slides over an outward facing portion of the voltage detector, wherein the ring portion mates flush against the front plate 12 (FIG. 3) when installed. The device 40 also comprises a body portion 44 that comprises electronic circuitry for voltage data storage and transmission, as well as a wireless communication device (e.g., transceiver, circuitry, etc.). The device 40 also comprises a communication status indicator 45. A USB connector 50 (e.g., C-type or other suitable USB connector) is also provided, which is received by the USB port (See FIGS. 1 and 3) on the voltage detector for data communication.

Figure 7:
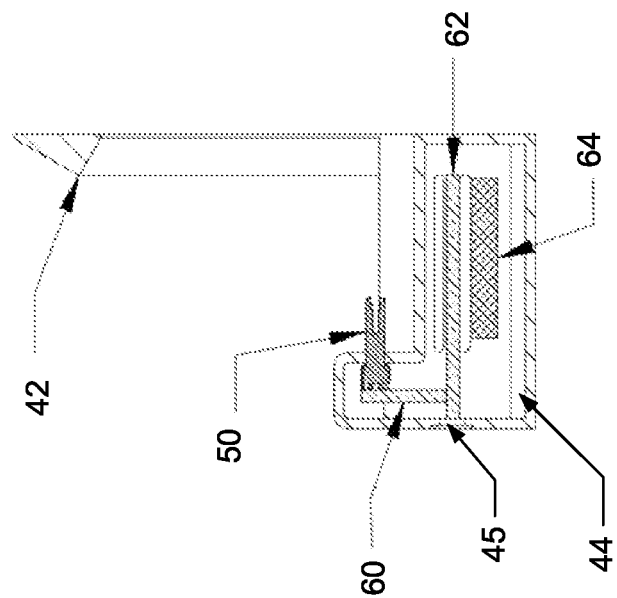
FIG. 7 illustrates a cut-away side view of the wireless connection device, in accordance with various features described herein.

FIG. 7 illustrates a cut-away side view of the wireless connection device 40, in accordance with various features described herein. The wireless connection device 40 comprises a ring portion 42 that slides over an outward facing portion of the voltage detector (not shown in FIG. 7), wherein the ring portion mates flush against the front plate 12 (FIG. 3) when installed. The device 40 also comprises a body portion 44 that comprises electronic circuitry 60, 62 for voltage data storage and transmission. A USB connector 50 (e.g., C-type or other suitable USB connector) is also provided, which is received by the USB port (See FIGS. 1 and 3) on the voltage detector for data communication. The body portion 44 of the device 40 comprises a first printed circuit board 60 that is coupled to the USB connector and also to a second PCB 62 that is coupled to a battery 64 or other power source, as well as to the wireless communication status indicator 45. In one embodiment, the PCB 62 comprises circuitry for providing wireless communication.

Figure 8:
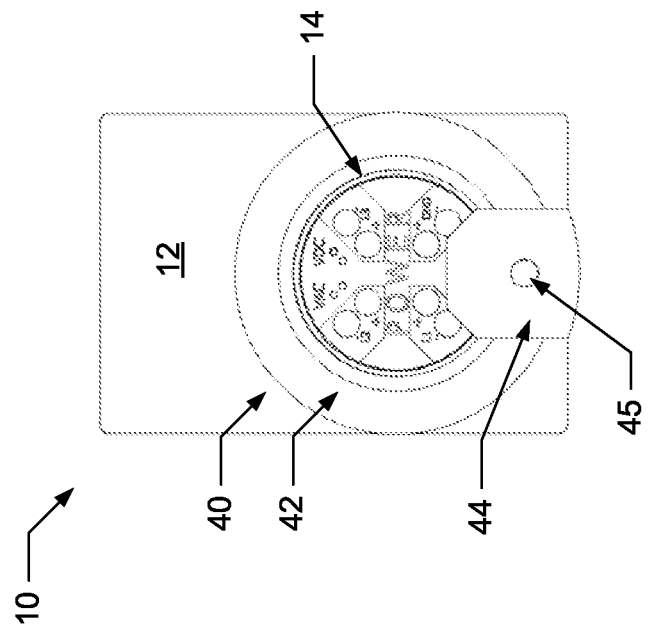
FIG. 8 illustrates a front view of the wireless connection device mounted to the voltage detector and the front plate, in accordance with various features described herein.

FIG. 8 illustrates a front view of the wireless connection device 40 mounted to the voltage detector 14 and the front plate 12, in accordance with various features described herein. The wireless connection device 40 comprises a ring portion 42 that slides over an outward facing portion of the voltage detector 14, wherein the ring portion mates flush against the front plate 12 (FIG. 3) when installed. The device 40 also comprises a body portion 44 that comprises a USB connector (not visible in FIG. 8) (e.g., C-type or other suitable USB connector) is also provided, which is received by the USB port (See FIGS. 1 and 3) on the voltage detector for data communication. Further provided is a wireless communication status indicator 45 that connects to the wireless communication device (e.g., transceiver, circuitry, etc.) for communicating processed voltage data to a remote device (e.g., smartphone, laptop, IoT device, etc.).

Figure 9:
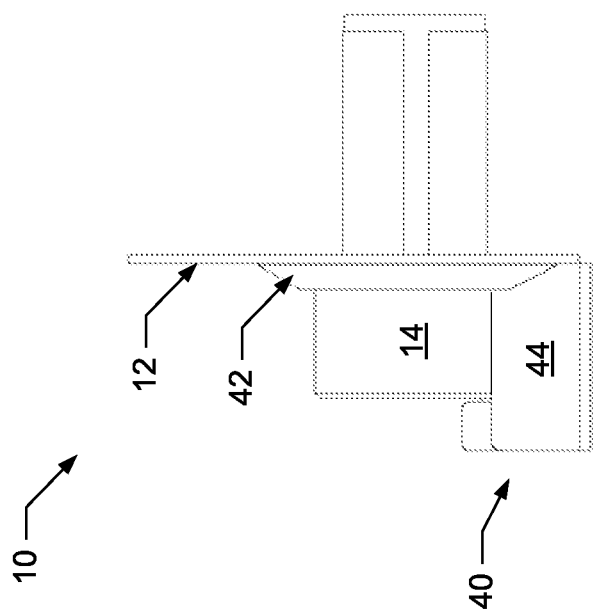
FIG. 9 illustrates a side view of the wireless connection device mounted to the voltage detector and the front plate, in accordance with various features described herein.

FIG. 9 illustrates a side view of the wireless connection device 40 mounted to the voltage detector 14 and the front plate 12, in accordance with various features described herein. The wireless connection device 40 comprises a ring portion 42 that slides over an outward facing portion of the voltage detector 14, wherein the ring portion mates flush against the front plate 12 (FIG. 3) when installed. The device 40 also comprises a body portion 44 that comprises USB connector (not visible in FIG. 9) (e.g., C-type or other suitable USB connector) is also provided, which is received by the USB port (See FIGS. 1 and 3) on the voltage detector for data communication.

Figure 10:
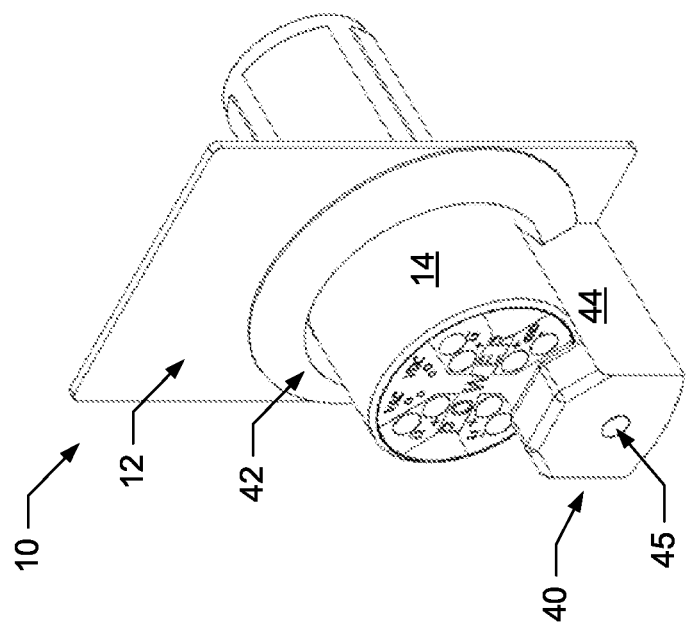
FIG. 10 illustrates a perspective view of the wireless connection device mounted to the voltage detector and the front plate, in accordance with various features described herein.

FIG. 10 illustrates a perspective view of the wireless connection device 40 mounted to the voltage detector 14 and the front plate 12, in accordance with various features described herein. The wireless connection device 40 comprises a ring portion 42 that slides over an outward facing portion of the voltage detector 14, wherein the ring portion mates flush against the front plate 12 (FIG. 3) when installed. The device 40 also comprises a body portion 44 that comprises a USB connector (not visible in FIG. 10) (e.g., C-type or other suitable USB connector) is also provided, which is received by the USB port (See FIGS. 1 and 3) on the voltage detector for data communication. Further provided is a wireless communication status indicator 45 (e.g., an LED or the like) that connects to a wireless communication device (e.g., transceiver, circuitry, etc.) for communicating processed voltage data to a remote device (e.g., smartphone, laptop, IoT device, etc.).

Figure 10A:
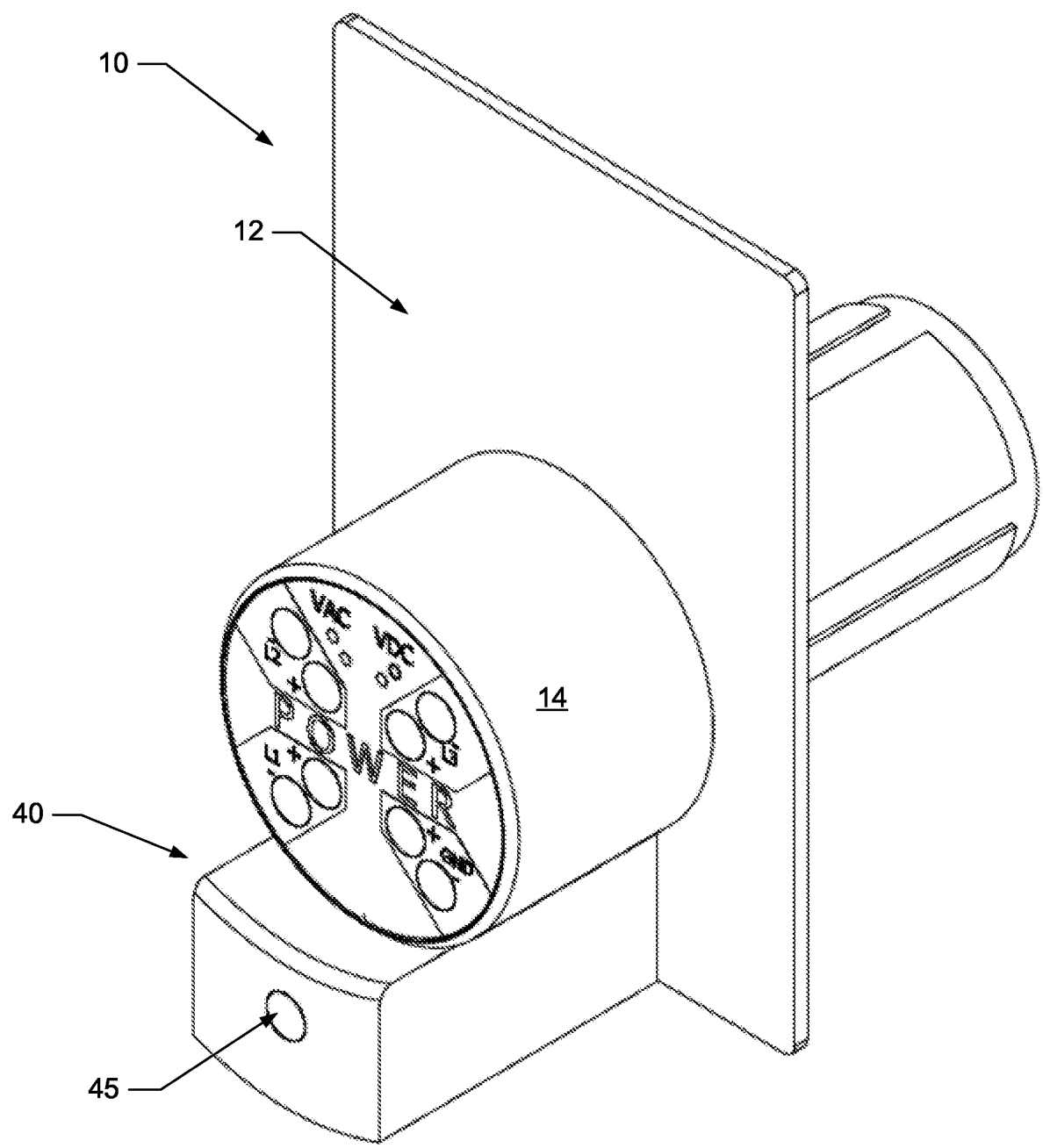
FIG. 10A illustrates a perspective view of the wireless connection device fully integrated to the voltage detector as a single assembly.

FIG. 10A illustrates a perspective view of the wireless connection device 40 fully integrated to the voltage detector 14 as a single assembly through the front plate 12, in accordance with various features described herein. Further provided is a wireless communication status indicator 45 (e.g., an LED or the like) that connects to a wireless communication device (e.g., transceiver, circuitry, etc.) for communicating processed voltage data to a remote device (e.g., smartphone, laptop, IoT device, etc.).

Figure 11:
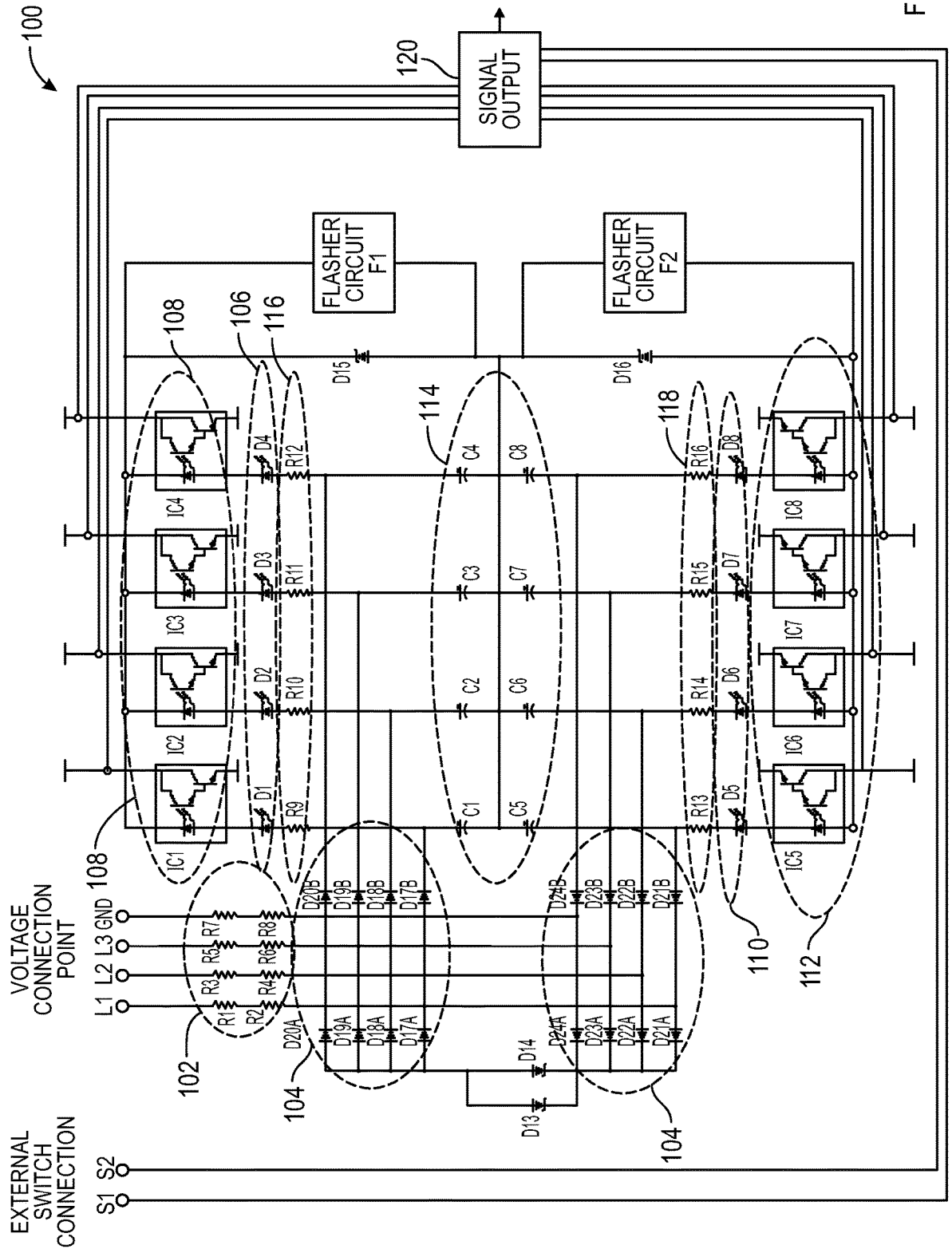
FIG. 11 shows a schematic of circuitry such as may be employed in the Smart voltage detection device, in accordance with various aspects described herein.

FIG. 11 shows a schematic of circuitry 100 such as may be employed in the Smart voltage detection device 10, in accordance with various aspects described herein. The Smart voltage detection device is a permanently mounted voltage indication device 10 that indicates the presence of voltage between any two connected wires and shows the status on the front LED indicators 16 (See FIGS. 1-10). There is also a switch status connection, S1, S2 to pass to the isolated output. With the increase of voltage, the flash rate of the LEDs 16 increases accordingly. There is an optocoupler, isolated detection device or the like 108 and 112 that is connected in series with each indication LED that provides an isolated output. With this isolated output, the Smart wireless connection device 40 connects with the Smart main device 10 to sense each pulse. The signal is processed and a voltage detection algorithm is executed (e.g., by one or more processors, not shown) on the signal to determine the voltage and polarity of each line being monitored. The voltage detection algorithm is also configured to monitor for changes and abnormalities (e.g., spikes, abnormal fluctuations, etc.) in the monitored parameters (e.g., voltage, current, power, etc.) between any two monitored lines. This data is processed and stored short term on the wireless connection device 40 so that it can then be transmitted wirelessly to a third device (e.g., a handheld device employed by a technician or the like). The transmission protocol to the third device can be Bluetooth, Bluetooth Mesh, Wi-Fi, ZigBee, or any other wireless communication. The third device that the unit connects to can be a Smart IOT device, SCADA system, Smart Phone type device or a computer for cloud storage.

The L1, L2, L3 and GND connections on the permanently mounted device 10 connect to the voltage lines to be monitored. The S1 and S2 connections connect to a dry contact switch, typically used for door closure status. Resistors R1-R8 (collectively shown by reference numeral 102) reduce the voltage and limit the current for the device 10. The diodes D17-D24 (collectively shown by reference numeral 104) act as a full wave rectifier for the indication circuit. Diodes D1-D4 (collectively shown by reference numeral 106) and optocouplers IC1-IC4 (collectively shown by reference numeral 108) indicate the positive polarity, and diodes D5-D8 (collectively shown by reference numeral 110) and optocouplers IC5-IC8 (collectively shown by reference numeral 112) indicate negative polarity. The pulse rate from the signals of IC1-IC8 is then transferred to the output signal on the wireless device 40.

According to an embodiment, when power is applied to any combination of lines L1, L2, L3 and GND the corresponding indicators will begin to illuminate. E.g., when an external AC voltage is connected between L1 and L2 then the path would be as follows: Power initially comes in From L1, into R1 (102) through a series connection of R2 (102), to parallel connection of D17A, D17B, D21A and D21B (104). The current flows out through D17B (104) to be partially rectified to go to a parallel connection for C1 (114) and R9 (116) to start charging up C1 (114) and allow a small amount of current to flow through R9 (116) to the series connection of D1 (106) through the series connection of IC1 (108) to the series connection of flasher circuit F1 and flasher circuit F2 with a partial reference to common parallel connection for capacitors of C1-C8 (114). Current then flows through series connection of IC6 (112) an on through the series connection of D6 (110) to a series connection of R14 (118) to a parallel connection of C6 (114) and D22B (104) allowing C6 (114) to charge and power to be rectified by D22B (104). Current then flows to the parallel connection of D22A, D18A, D18B (104) and R4 (102), and on through the series connection of R4 (102) to the series connection of R3 (102) and back out to L2. Once enough voltage has built up, the flashers activate allowing for a more direct current path that allows the discharge of C1 and C6 (114) to illuminate D1 (106), and IC1 (108) as well as D6 (110) and IC6 (112). Additionally, when current flows through D22B (104), the parallel connection of R4 (102) and D22A (104) have current flow through D22A (104) and through the parallel connection of D13 and D14 and then through the series connection of D18A (104) to parallel connection of R4 (102) and D18B (104) to flow out R4 through R3 (102) to L2. The reverse current path changes the L1 and L2 indicators to show the polarity direction.

The pulsed output from IC1 to IC8 (108 and 112) indicates the polarity and voltage level of the monitored connections. The output from IC1 to IC4 (108) gives an indication of positive polarity, with output from IC5 to IC8 (112) giving an indication of negative polarity. This information is transmitted to the signal output connection that then connects to the wireless device (40).

The visual LED indicators D1 to D4 (106) show an indication of positive polarity on the front of the voltage detection device (10). The visual indicators D5 to D8 (110) show an indication of negative polarity on the front of the device. The resistors R9 to R12 (116) and resistors R13 to R16 (118) facilitate determining the initial intensity of the indicator, limiting how much current can flow through the D1 to D4 (106) and IC1 to IC4 (108) along with D5 to D8 (110) and IC5 to IC8 (112).

The Zener diodes D13, and D14 limit how much total voltage can go across total indication and detection circuit. The Zener diodes D15 and D16 keep the voltage level on the flasher circuits F1 and F2 to a predetermined level, not to allowing an overvoltage charge within the flasher circuits.

Flasher circuits F1 and F2 help determine the flashing rate at different voltage levels to ensure a flash rate that is detectible by the algorithm. The signal output (120) is the connection interface between schematic (100) and the signal input (202) of the wireless adapter schematic (200).

Figure 13:
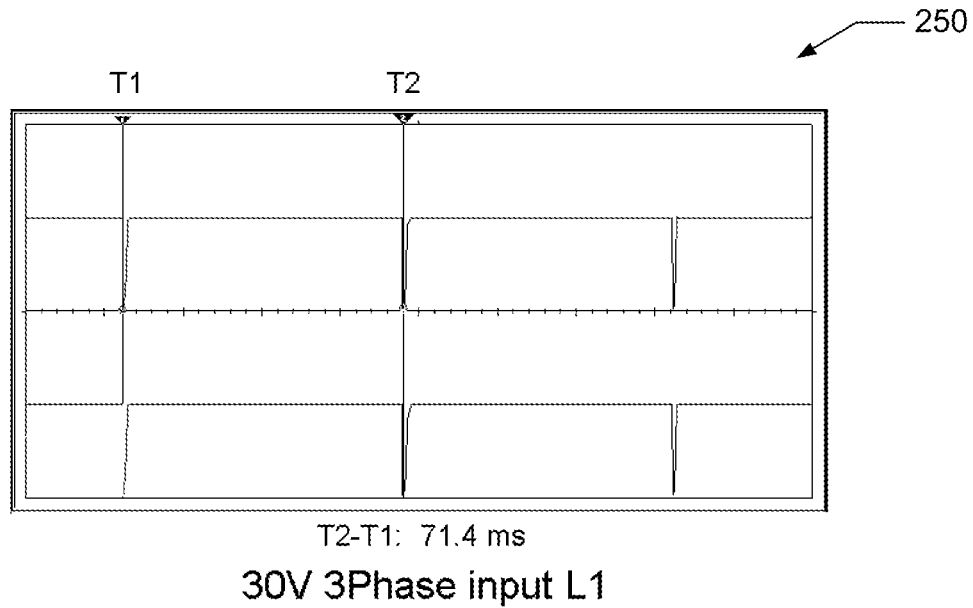
FIG. 13 shows a graph of a 30V 3-phase input signal on L1.

A sample pulse of the signal is shown in FIG. 13. The Smart wireless device 40 provides the power to the external side of the smart voltage indicator device optocouplers so that no hazardous voltage is present at the external connections on the front of the device 10.

The Smart wireless device 10 connects to an output of the Smart voltage detector device 10. Power from the wireless device 40 is provided to the external connection side of the optocoupler that transmits the output voltage pulse signals from the Smart voltage indicator device 10. The voltage pulse signals are converted to a digital signal that can then be process by a custom algorithm that analyzes and determines the approximate voltage from differences in the pulses from the Smart voltage indicator device 10. The wireless device 40 is configured to determine which wires have voltage present, and the polarity of the voltage applied whether it be an AC or DC source. The collected data is relayed to the wireless connection device 40 to be transmitted out via the selected wireless transmission protocol, which may be any of internet of things (IOT) communications, such as Bluetooth, Bluetooth mesh, ZigBee, Wi-Fi, or the data can be transmitted to a cloud storage device for further processing.

Figure 12:
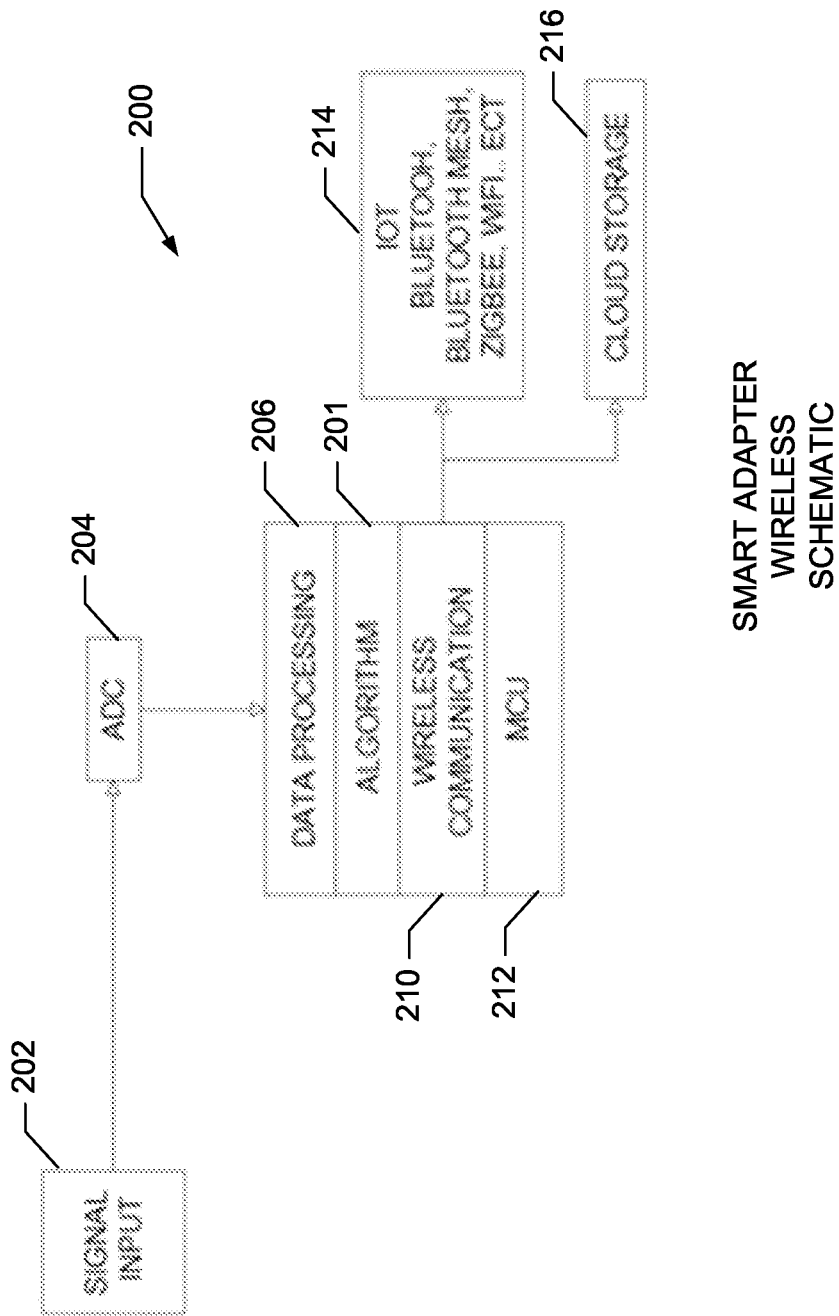
FIG. 12 illustrates a framework for executing an algorithm for voltage pulse detection, in accordance with various features described herein.

FIG. 12 illustrates a framework 200 for executing an algorithm 201 for voltage pulse detection, in accordance with various features described herein. The framework comprises a signal input 202, which comprises the output received from the Smart voltage detection device 10 described in FIGS. 1-11. An analog-to-digital converter (ADC) 204 converts the received signal from analog signal to digital signal for processing. A data processing unit 206 (e.g., a processor or the like) performs data processing to identify voltage across monitored lines, as well as polarities, magnitudes, and pulse rate and width thereof. A wireless communication module or protocol is also provided for transmitting monitored and/or detected voltage information to a remote device (e.g., a smartphone of IoT device, or the like). Additionally, the framework comprises a microcontroller unit (MCU) 212, which is configured to execute or perform the data processing, the algorithm, and or the wireless communication protocol. Wireless communication is performed at 214 using any suitable wireless communication protocol, BlueTooth, BlueTooth mesh, Zigbee, Wifi, etc. Cloud storage 214 is also provided so that the detected or monitored voltage and actionable status information can be accessed remotely.

The framework 200 analyzes (i.e., via a processor, not shown) each output from the Smart voltage detection device 10 to determine which monitored lines are connected, as well as the polarity and voltage level detected. For a DC source, the outputs from IC1 to IC4 indicate positive polarity, and the outputs from IC5 to IC8 indicate a negative polarity source. For an AC source, the outputs from IC1 to IC8 are active. The outputs from IC1 and IC5 transmit the L1 wire connection, the outputs of IC2 and IC6 transmit the L2 connection, the outputs of IC3 and IC7 transmit the L3 connection and the outputs of IC4 and IC8 are the GND connection.

To determine the magnitude of the voltage of the source, the wireless connection device 40 executes the algorithm (e.g., via a processor, not shown) to sample each detected phase and determine the spacing between each signal pulse, as well as the duration of each pulse signal. In one embodiment, the wireless connection device 40 comprises a microcontroller unit MCU or processor that executes the described algorithm on the received voltage data in order to determine which line(s) is/are active, what type of voltage is present (e.g., AC or DC), polarity thereof, and/or the magnitude of the voltage present. With the pulse rate, pulse width and knowledge of which connection is active, the algorithm processes and calculates which lines are connected, the magnitude of the voltage present, and whether it is an AC or DC source.

FIGS. 13-24 show sample frequency and pulse width of the output at different voltage input levels from 30V AC to 600V AC and 120 VDC.

FIG. 13 shows a graph 250 of a 30V 3-phase input signal on L1.

Figure 14:
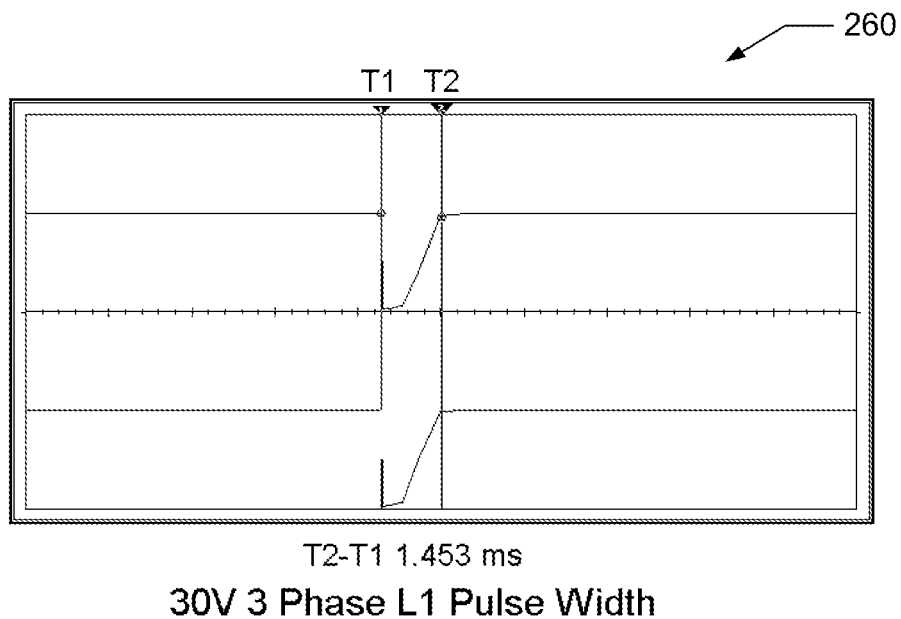
FIG. 14 shows a graph of a 30V 3-phase output pulse width on L1.

FIG. 14 shows a graph 260 of a 30V 3-phase output pulse width on L1.

Figure 15:
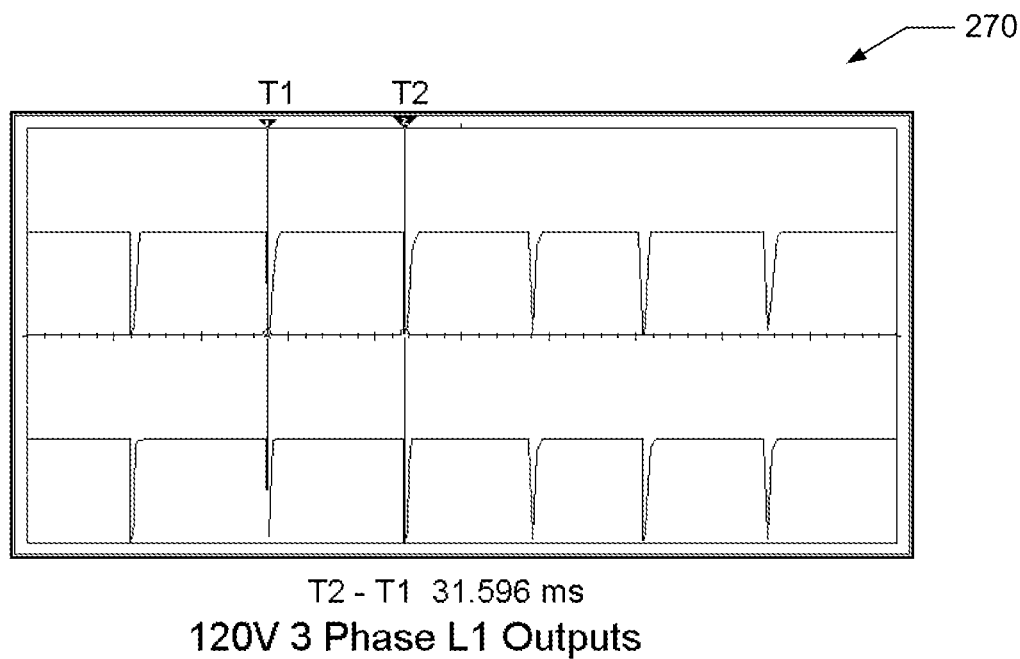
FIG. 15 shows a graph of a 120V 3-phase L1 output signal.

FIG. 15 shows a graph 270 of a 120V 3-phase L1 output signal.

Figure 16:
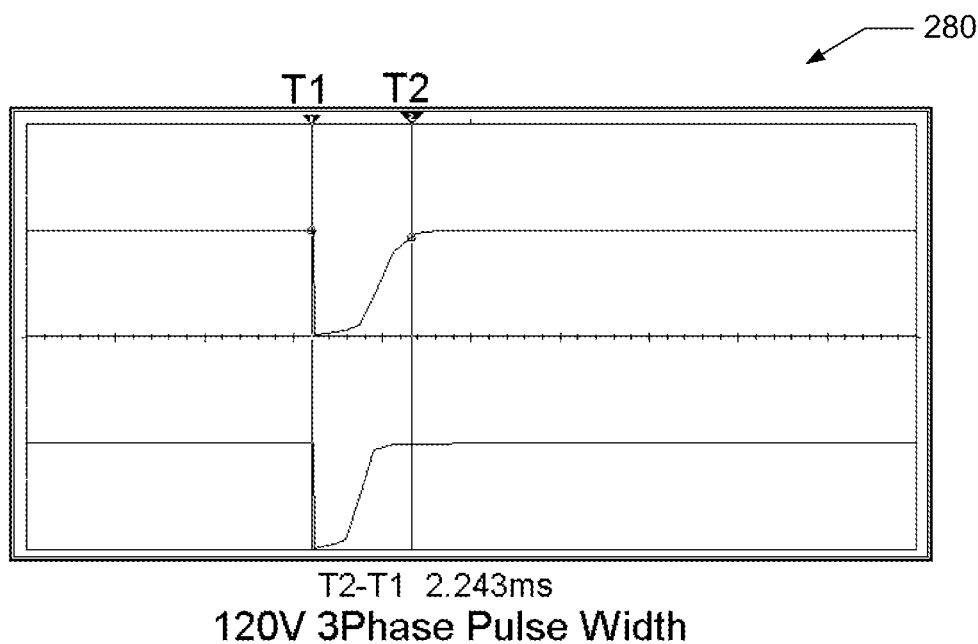
FIG. 16 shows a graph of a 120V 3-phase output pulse width on L1.

FIG. 16 shows a graph 280 of a 120V 3-phase output pulse width on L1.

Figure 17:
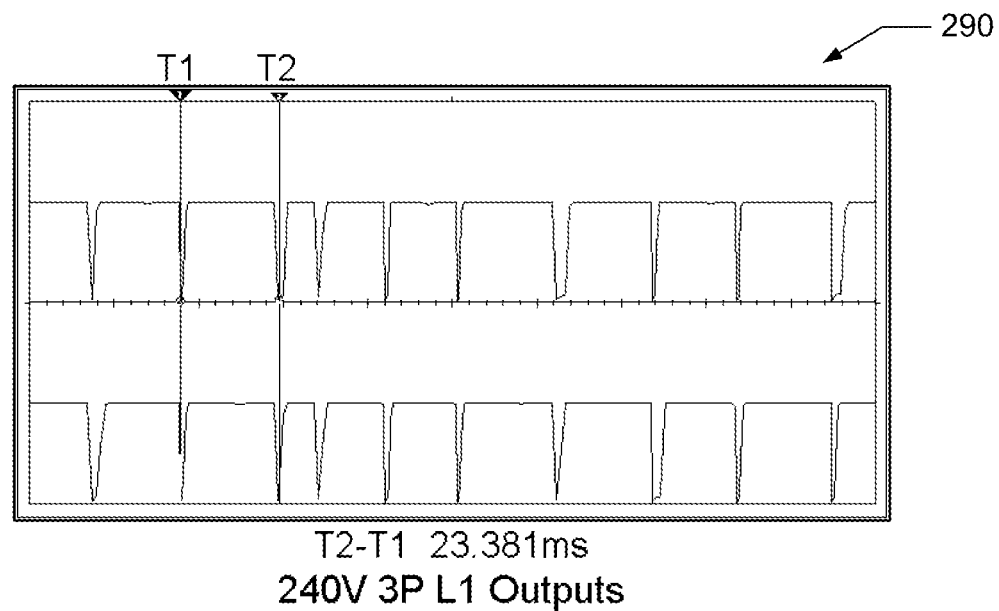
FIG. 17 shows a graph of a 240V 3-phase L1 output signal.

FIG. 17 shows a graph 290 of a 240V 3-phase L1 output signal.

Figure 18:
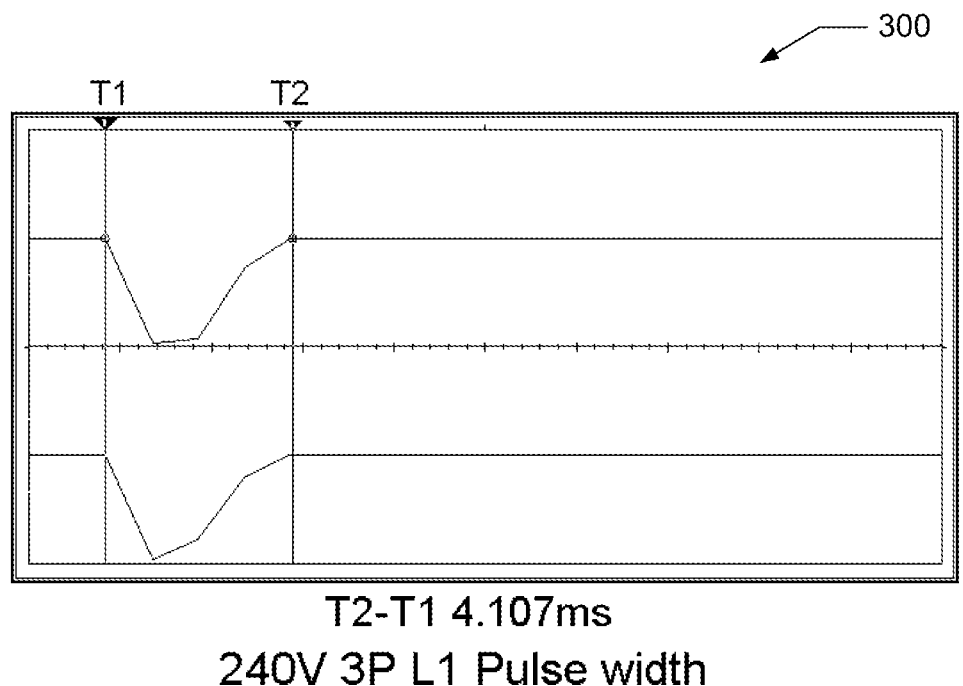
FIG. 18 shows a graph of a 240V 3-phase output pulse width on L1.

FIG. 18 shows a graph 300 of a 240V 3-phase output pulse width on L1.

Figure 19:
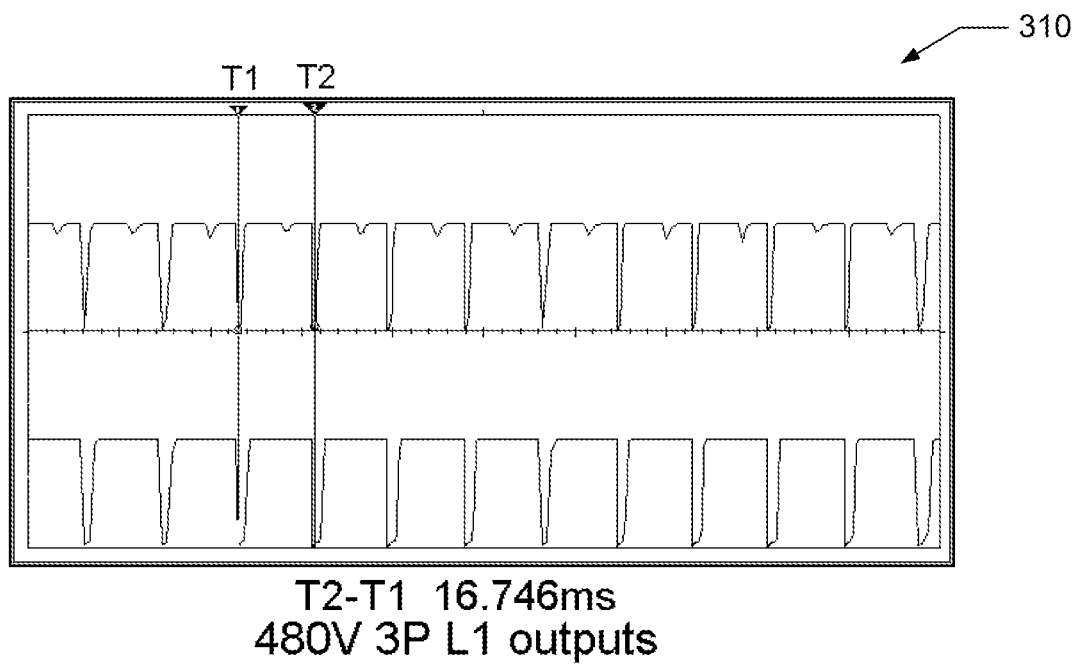
FIG. 19 shows a graph of a 480V 3-phase L1 output signal.

FIG. 19 shows a graph 310 of a 480V 3-phase L1 output signal.

Figure 20:
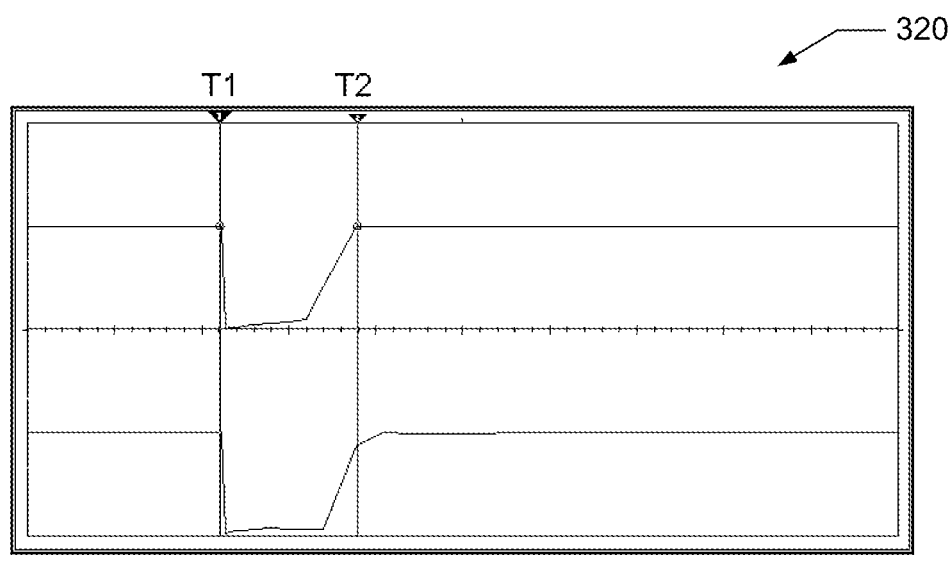
FIG. 20 shows a graph of a 480V 3-phase output pulse width on L1.

FIG. 20 shows a graph 320 of a 480V 3-phase output pulse width on L1.

Figure 21:
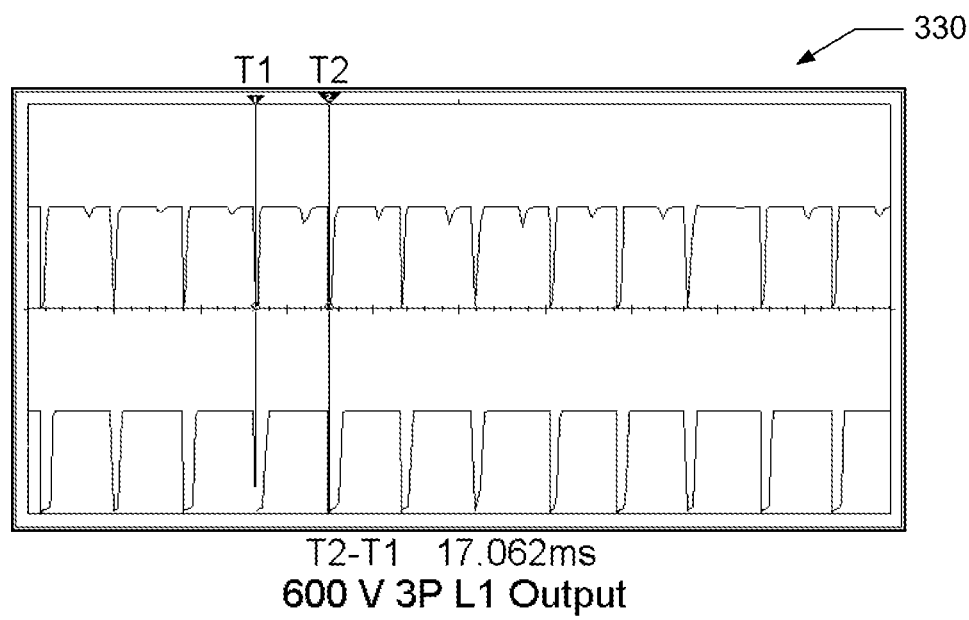
FIG. 21 shows a graph of a 600V 3-phase L1 output signal.

FIG. 21 shows a graph 330 of a 600V 3-phase L1 output signal.

Figure 22:
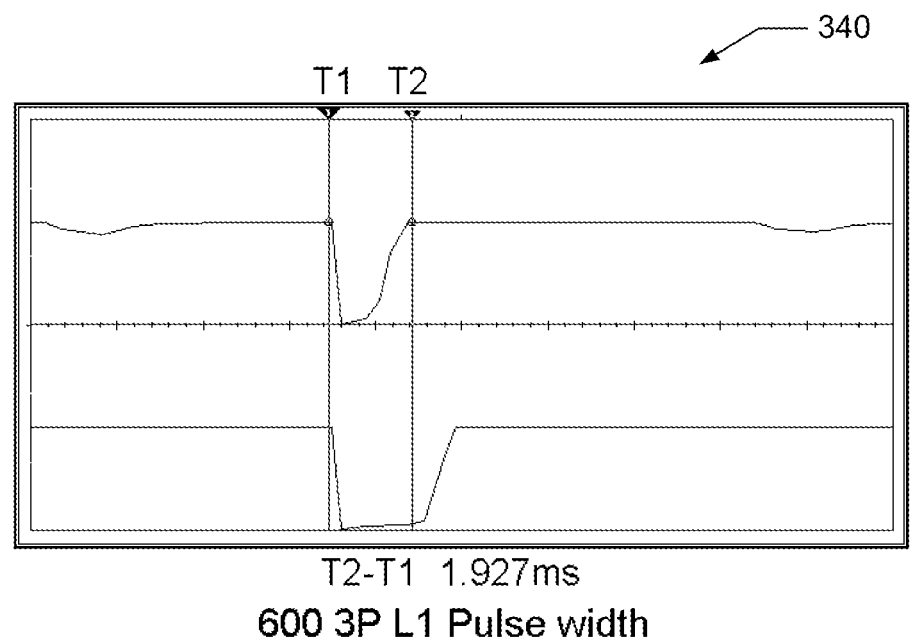
FIG. 22 shows a graph of a 600V 3-phase output pulse width on L1.

FIG. 22 shows a graph 340 of a 600V 3-phase output pulse width on L1.

According to various examples, the 3 phase arrangements described herein consist of 4 wire connections using a Delta configuration with 3 wire connections plus a ground connection, or a 5 wire connection using a Wye configuration with 4 wire connections plus a ground connection.

Figure 23:
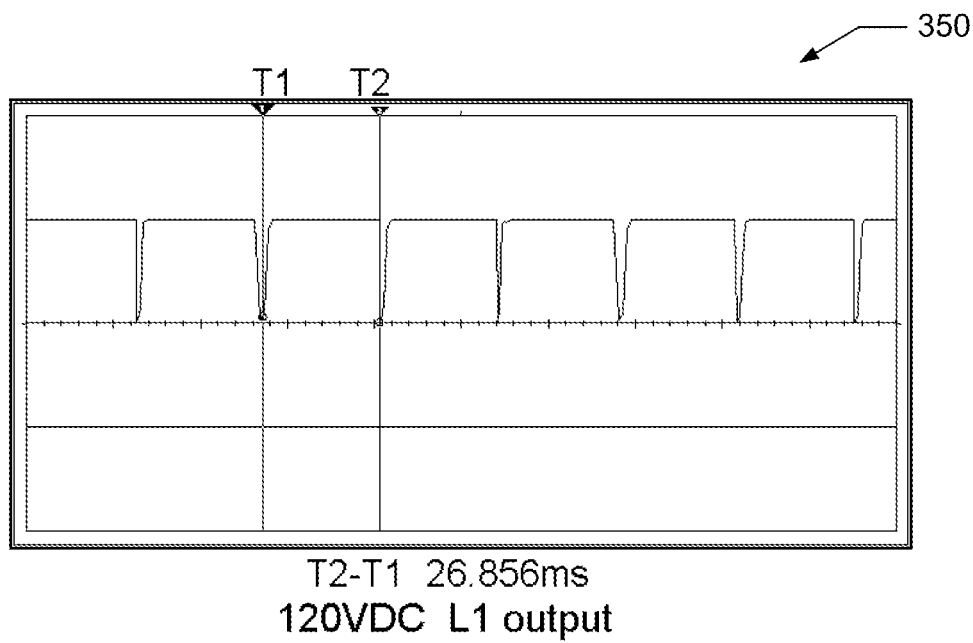
FIG. 23 shows a graph of a 120V DC L1 output signal.

FIG. 23 shows a graph 350 of a 120V DC L1 output signal.

Figure 24:
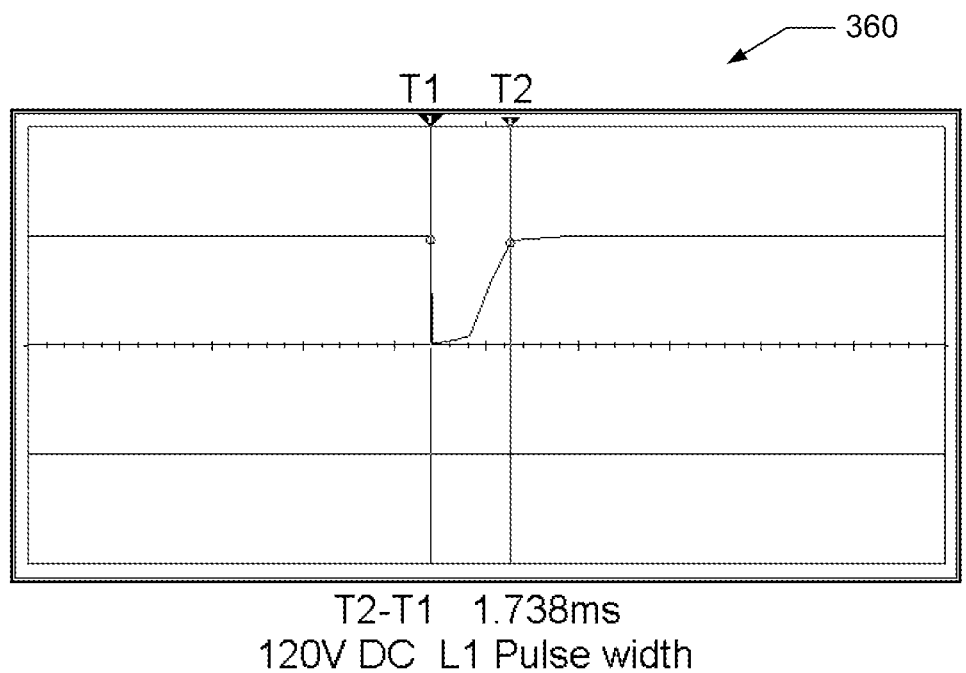
FIG. 24 shows a graph of a 120V DC output pulse width on L1.

FIG. 24 shows a graph 360 of a 120V DC output pulse width on L1.

Table 1 below shows a sample of the measured output signals to be processed with respect to input voltage and the signal needed to process for the L1 connection.

TABLE 1

| Input voltage | Time between pulses | Frequency | Pulse Width |
|---|---|---|---|
| 30 V 3P | 71.40 ms | 14.01 Hz | 1.45 ms |
| 120 V 3P | 31.50 ms | 31.75 Hz | 2.20 ms |
| 240 V 3P | 23.30 ms | 42.92 Hz | 4.10 ms |
| 480 V 3P | 16.76 ms | 59.67 Hz | 3.10 ms |
| 600 V 3P | 17.00 ms | 58.82 Hz | 1.90 ms |
| 120 V DC | 26.80 ms | 37.31 Hz | 1.70 ms |

In this manner, the herein described system facilitates providing a smart wireless connection device 40 for wirelessly transmitting measured and/or detected voltage signals from a permanently-mounted voltage detection device 10, in accordance with various aspects described herein.

The claimed innovation has been described with reference to the various embodiments. Modifications and alterations will occur to others upon reading and understanding the preceding detailed description. It is intended that the embodiments described herein be construed as including all such modifications and alterations insofar as they come within the scope of the appended claims or the equivalents thereof.

The invention claimed is:

1. A wireless connection device that facilitates providing wireless transmission of detected voltages on monitored power lines, comprising:
   a housing configured for placement outside of an electrical enclosure box;
   a communication connector via which the wireless connection device receives detected voltage information from a voltage detection device for a plurality of monitored power lines, the voltage detection device housed separate from the wireless connection device and configured for mounting to the electrical enclosure box such that a face of the voltage detection device and lighting elements disposed thereon are visible when the electrical enclosure box is closed;
   one or more printed circuit boards (PCB)s comprising circuitry for processing the received detected voltage information to provide processed voltage information and wherein the processing comprises applying a voltage detection algorithm to monitor for changes and abnormalities in monitored parameters between any two of the plurality of monitored power lines, the one or more printed circuit boards disposed within the housing; and
   a wireless transceiver disposed within the housing, the wireless transceiver configured to transmit the processed voltage information wirelessly for presentation and storage on a remote device.

2. The wireless connection device according to claim 1, wherein the communication connector is a USB connector.

3. The wireless connection device according to claim 1, wherein connector is a USB-C type connector.

4. The wireless connection device according to claim 1, wherein the voltage detection device is a permanently mounted voltage detection device and wherein the connector mates with and receives the detected voltage information through a corresponding communication socket on the permanently mounted voltage detection device.

5. The wireless connection device according to claim 1, wherein the wireless transceiver is configured to transmit via a BlueTooth mesh network connection.

6. The wireless connection device according to claim 1, wherein the communication connector is a multipin connector.

7. The wireless connection device according to claim 1, wherein the voltage detection algorithm is configured to determine a magnitude of an input voltage on a given line from the detected voltage information.

8. The wireless connection device according to claim 1, wherein the voltage detection algorithm records a time stamp for the changes and abnormalities to provide timestamped changes and timestamped abnormalities.

9. The wireless connection device according to claim 8, wherein the timestamped changes and the timestamped abnormalities are recorded and then saved in cloud storage.

10. The wireless connection device according to claim 1, wherein the wireless connection device fits around a permanently mounted voltage detection device.

11. The wireless connection device according to claim 1, wherein the wireless connection device is connected to an LED indicator.

12. A system comprising the wireless connection device according to claim 1, and the voltage detection device and wherein the voltage detection device is configured to detect voltage from current flow between any two of L1, L2, L3 and GND, where input is one of AC single Phase, AC 3 Phase, 4 or 5 wires systems, and DC.

13. The system according to claim 12, further comprising one or more indicators coupled to isolated detection devices.

14. A system that facilitates providing wireless transmission of detected voltages on monitored lines, comprising:
   a voltage detection device for mounting to an electrical enclosure box such that a face of the voltage detection device with a plurality of lighting elements is visible while the electrical enclosure box is closed;
   a wireless connection device comprising:
   a communication connector via which the wireless connection device receives detected voltage information from the voltage detection device for a plurality of monitored lines;
   one or more printed circuit boards (PCB's) comprising circuitry for processing the received detected voltage information to provide processed voltage information and wherein the processing comprises applying a voltage detection algorithm to monitor for changes and abnormalities in monitored parameters between any two of the plurality of monitored lines; and
   a wireless transceiver that transmits the processed voltage information wirelessly for presentation and storage on a remote device;
   a housing for the wireless connection device wherein the communication connector, the one or more printed circuit boards, and the wireless transceiver are disposed within the housing and the communication connector is operatively connected to the voltage detection device while the housing is outside of the electrical enclosure box.

15. The system according to claim 14, further comprising one or more indicators coupled to isolated detection devices.

16. The system according to claim 14, wherein the voltage detection algorithm is configured to determine a magnitude of an input voltage on a given line from the detected voltage information.

17. The system according to claim 14, configured to detect voltage current flow between any two of L1, L2, L3 and GND, wherein the detected voltages are associated with one of: AC single phase, AC 3-phase, 4 or 5 wire systems, and DC.

18. The system according to claim 14, wherein the wireless connection device is connected to an LED indicator.

19. A system comprising:
- a voltage detection device having a housing configured for mounting to an electrical enclosure box and further comprising a voltage indicator face and a plurality of LED indicators visible at the voltage indicator face to visually indicate status of L1, L2, L3, and GND monitored lines, wherein the voltage indicator face is positioned outside of the electrical enclosure box while the housing is mounted to the electrical enclosure box and visible when the electrical enclosure box is closed;
- a wireless connection device that facilitates providing wireless transmission of detected voltages on the L1, L2, L3, and GND monitored lines, the wireless connection device having a single housing positioned outside of the electrical enclosure box;
- a communication connector via which the wireless connection device receives detected voltage information from the voltage detection device for the monitored lines while the wireless connection device is positioned outside of the electrical enclosure box and the communication connector is physically connected to a connector on the voltage indicator face;
- and one or more printed circuit boards (PCB)s disposed within the single housing and comprising circuitry for processing the received detected voltage information to provide processed voltage information and wherein the processing comprises applying a voltage detection algorithm to monitor for changes and abnormalities in monitored parameters between any two of the plurality of monitored lines.

20. The system of claim 19 wherein the voltage detection algorithm records a time stamp for the changes and abnormalities to provide timestamped changes and timestamped abnormalities.

* * * * *